United States Patent

Saitoh et al.

[11] Patent Number: 5,843,228
[45] Date of Patent: Dec. 1, 1998

[54] APPARATUS FOR PREVENTING HEATER ELECTRODE MELTDOWN IN SINGLE CRYSTAL PULLING APPARATUS

[75] Inventors: Masao Saitoh; Daisuke Wakabayashi; Takashi Atami; Hisashi Furuya, all of Tokyo, Japan

[73] Assignees: Mitsubishi Materials Silicon Corporation; Mitsubishi Materials Corporation, both of Tokyo, Japan

[21] Appl. No.: 825,637

[22] Filed: Apr. 1, 1997

[30] Foreign Application Priority Data

Apr. 9, 1996 [JP] Japan .................................. 8-086905

[51] Int. Cl.[6] .................................................. C30B 35/00
[52] U.S. Cl. ........................... 117/201; 117/202; 117/222
[58] Field of Search ................................ 117/29, 30, 48, 117/201, 202, 204, 220, 222

[56] References Cited

U.S. PATENT DOCUMENTS 3,906,181  9/1975  Hibino et al. ............................ 117/222
5,616,175  4/1997  Walsh ...................................... 117/200

FOREIGN PATENT DOCUMENTS 63-303894  12/1988  Japan .
4-305091   10/1992  Japan .
466-906A    4/1975  U.S.S.R. ................................ 117/204

Primary Examiner—Felisa Garrett
Attorney, Agent, or Firm—Cushman Darby & Cushman IP Group of Pillsbury Madison & Sutro

[57] ABSTRACT

The invention is directed to preventing meltdown of conductive metal electrodes 5, 5 used to supply current to a heater 104 of a crucible 103. A single crystal pulling apparatus comprises: the heater 104 which encircles the crucible 103, and the pair of electrodes 5, 5, respectively threaded to a pair of graphite intermediate electrodes 6 of the heater 104, and a voltage source 9 for supplying power to the pair of electrodes 5, 5. A switch 11 switches the power on and off. A watthour meter 10a, continuously measures the current flowing through the heater 104. Investigation by the present inventors showed that in the case of a crack 8 in a lower portion of the intermediate electrode 6, minute fluctuations occurred in the measured value of the current, arising from an electric discharge phenomena in the crack 8 prior to meltdown of the electrodes 5, 5. Therefore, if fluctuations in the electric current measured by the wattmeter 10a are outside of a tolerance range, the controller 12 switches off the switch 11, thus interrupting power to the electrodes 5, 5, and preventing meltdown of the electrodes 5, 5.

4 Claims, 4 Drawing Sheets

APPARATUS FOR PREVENTING HEATER ELECTRODE MELTDOWN IN SINGLE CRYSTAL PULLING APPARATUS

FIELD OF THE INVENTION

The present invention relates to a single crystal pulling apparatus where a single crystal of semiconductor is pulled from a semiconductor melt stored in a crucible, and in particular relates to an apparatus for preventing meltdown (melting) of conductive metal electrodes of a heater which is employed in heating the crucible.

DESCRIPTION OF THE RELATED ART

The CZ growth technique is an example of one of the currently known methods for growing single crystals of semiconductors such as silicon (Si) or gallium arsenide (GaAs).

Because the CZ growth technique enables simple generation of large diameter, high purity single crystals which are free from dislocation or have extremely low levels of lattice defect, it is widely used in the growing of a variety of semiconductor crystals.

In recent years, the demand for larger diameter, higher purity single crystals with uniform levels of oxygen concentration and impurity concentration, has seen this CZ growth technique improved in various ways, to meet these demands.

One of the improvements of the aforementioned CZ growth technique which has been proposed, is a continuous magnetic field application CZ technique (hereafter abbreviated as CMCZ technique), which employs a double crucible. Features of this technique are that it enables the growth of single crystals with good slip-free ratios and with extremely good control of oxygen concentration levels, by external application of a magnetic field to the semiconductor melt inside the crucible, which suppresses convection in the semiconductor melt, and that it enables the simple generation of long single crystals of the semiconducting material by allowing continuous supply of the source materials, to a position located between outer and inner crucibles. Consequently, this method is recognized as one of the best for obtaining large diameter, long single crystals of semiconducting materials.

FIG. 4 shows an example of a single crystal silicon pulling apparatus proposed in Japanese Patent Application First Publication No. Hei-4-305091 which employs the CMCZ technique outlined above. With this single crystal pulling apparatus 101, a double crucible 103, a heater 104, and a source material supply tube 105 are positioned inside a hollow gas tight chamber 102, and a magnet 106 is positioned outside the chamber 102.

The present invention, as discussed later however, is applicable not only to single crystal pulling apparatus employing the CMCZ technique, but can also be applied to single crystal pulling apparatus employing the continuous charge type CZ technique (CCZ technique) where a magnetic field is not applied, or to single crystal pulling apparatus equipped not with a double crucible, but with a single crucible.

The double crucible 103 comprises an approximately hemispherical outer crucible 111 made from quartz (SiO$_2$), and an inner crucible 112 made from quartz, which is a cylindrical partition body which is fitted inside the outer crucible 111. The side wall of the inner crucible 112 contains a plurality of connecting apertures 113 which connect the area between the respective inner and outer crucibles 112 and 111 (the source material melt region) with the inside of the inner crucible 112 (the crystal growing region).

This double crucible 103 is mounted on a susceptor 115, which sits on a vertical shaft 114 located centrally at the lower portion of the chamber 102, and can be rotated in a horizontal plane at a specified angular velocity about the axis of the shaft 114. The semiconductor melt 121 (the source material for the generation of single crystals of semiconductor, melted by heating) is stored inside this double crucible 103.

The substantially cylindrical heater 104 heats and melts the semiconductor source material inside the crucible, and also maintains the temperature of the thus produced semiconductor melt 121. Normally resistance heating is used. The detailed construction of the heater 104 is discussed later. The source material supply tube 105 serving as a source material supply device, is used to continuously inject a specified volume of semiconductor source material 110 from a lower end opening thereof, onto the surface of the semiconductor melt between the outer crucible 111 and the inner crucible 112.

Examples of the source materials 110 which can be supplied through the source material supply tube 105 mentioned above include polysilicon which has been converted to flake form by crushing in a crusher, or polysilicon granules deposited from gaseous source material using thermal decomposition, with further supply, as necessary, of elemental additives known as dopants, such as boron (B) (in the case of production of p-type single crystals of silicon) and phosphorus (P) (in the case of production of n-type single crystals of silicon).

In the case of gallium arsenide (GaAs), the operation is the same as that outlined above, but in this case, the elemental additive used is either zinc (Zn) or silicon (Si).

With the single crystal pulling apparatus 101 outlined above, a seed crystal 125 is suspended from a chuck (not shown in the figures) on a pulling shaft 124 located above the inner crucible 112 and over the shaft axis line, and a single crystal of semiconductor 126 is grown at an upper surface of the semiconductor melt 121 around a nucleus of the seed crystal 125.

However, as has been disclosed in Japanese Patent Application First Publication No. Sho-63-303894, with this type of single crystal pulling apparatus, the growing of single crystals requires that first the polycrystalline source material, such as lumps of polysilicon, be melted, and the resulting semiconductor melt 121 stored inside the outer crucible 111, with the double crucible 103 then being formed by positioning the inner crucible 112 above the outer crucible 111 and then mounting it onto the outer crucible 111.

The reason that the double crucible 103 is formed after melting of the polycrystalline source material, is that in order to effect complete melting of the polycrystalline source material to obtain the semiconductor melt 121, the temperature of the source material inside the outer crucible 111 needs to be raised, using the heater 104, to a temperature hotter than the single crystal growing temperature. If the inner crucible 112 were to be mounted on the outer crucible prior to the melting stage, large thermal deformation of the inner crucible 112 would occur.

Consequently, by mounting the inner crucible 112 on the outer crucible 111 after complete melting of the source material and a subsequent lowering in the heat being applied by the heater 104, the high temperatures required in the initial source material melting stage can be avoided, and deformation of the inner crucible suppressed.

Furthermore, the connecting apertures 113 of the inner crucible 112 are set at a predetermined aperture area small enough to ensure that when source material is added, the semiconductor melt 121 will flow only from the outer crucible 111 to the inner crucible 112. The reason for this restriction is that if the phenomenon arose where, through convection, the semiconductor melt was able to flow from the crystal growing region back to the source material melt region, the control of impurity concentrations during the single crystal growth, and the control of the melt temperature would become problematic.

FIG. 5A and FIG. 5B are a plan view and an elevation view respectively of one example of the aforementioned heater 104, while FIG. 6 is an enlarged view of an electrode portion of the heater 104.

As shown in FIG. 5A and FIG. 5B, the heater 104 is approximately cylindrical in shape, and is equipped with integral protruding portions 1, 2 which protrude out from portions on opposite sides of the bottom edge of the heater 104. Furthermore, the heater 104 is equipped with a plurality of slits 3 which are alternately cut into the upper edge and then the lower edge of the heater 104, extending in a vertical direction. As a result, application of a voltage across the pair of protruding portions 1, 2 causes a current to flow through the heater 104 in the direction indicated by the arrows D in FIG. 5B. Moreover, configurations where the protruding portions 1, 2 protrude inside the heater are also possible.

With the electrode portion of the heater 104, as shown in FIG. 6, the protruding portion 1 of the heater 104 is equipped with a through aperture 1a, and a screw portion 6a of a graphite intermediate electrode 6 is inserted through the aperture 1a. A nut 7 is threaded onto the screw portion 6a, thus fixing the electrode to the protruding portion 1.

A threaded aperture 6b is formed in the lower end of the intermediate electrode 6, and a threaded portion 5a of a conductive metal electrode 5 is screwed into this threaded aperture 6b. The conductive metal electrode 5 comprises the threaded portion 5a at an upper end, a flange portion 5b and a small diameter main body portion 5c. The main body portion 5c is fitted with a water coolant passage 5d which extends axially through the main body. The conductive metal electrode 5 is typically formed from a metal such as copper, copper alloy, or stainless steel, although it is not limited to these materials.

A lower end of the intermediate electrode 6 contacts an upper surface of the flange portion 5b of the conductive metal electrode 5. The small diameter main body portion 5c passes through a base portion 102a of the chamber 102 (refer to FIG. 4), and furthermore, to ensure the main body portion 5c does not contact the base portion 102a, a sleeve 4 formed from insulating material is fitted into the base portion 102a.

The construction of the electrode at the other protruding portion 2 of the heater 104 is identical to that of the electrode at the protruding portion 1, and so drawings and explanation are omitted.

Using the above configuration, a voltage is applied across the two conductive metal electrodes 5, 5 (one electrode not shown in the figures, one electrode positive, the other negative) enabling an electric current of predetermined value (for example 1500 amperes) to be passed through the heater 104.

In those instances shown in FIG. 6, where due to factors such as vibration of the heater 104 or wear of the intermediate electrode 6, a crack 8 forms in the lower portion of the intermediate electrode 6 (the threaded aperture portion), the supply of electric current from the conductive metal electrode 5 to the intermediate electrode 6 will be concentrated in the threaded portion 6b above the crack 8. As a result the temperature of the water inside the water coolant passage 5d will rise, and portions of the water will start boiling, creating a steam filled space in the upper portion of the water coolant passage 5d. If electric current supply to the heater is continued under these conditions, the cooling efficiency on those portions of the conductive metal electrode 5 not directly contacting the water coolant will decrease, resulting in the probable meltdown of the conductive metal electrode 5. If the conductive metal electrode starts to melt, the water coolant from inside the water coolant passage 5d will start bubbling into the inside of the chamber 102 (refer to FIG. 4), causing contamination problems.

The present invention takes into consideration the above problems associated with the current technology, with the object of providing an apparatus for preventing heater electrode meltdown in a single crystal pulling apparatus, whereby meltdown of the conductive metal electrodes of the heater can be prevented.

SUMMARY OF THE INVENTION

In order to meet the above object, the apparatus of the present invention for preventing heater electrode meltdown in a single crystal pulling apparatus comprises:

a gas tight container, a crucible for storing a semiconductor melt inside the gas tight container, a heater which encircles the crucible, a pair of conductive metal electrodes, each having a water coolant passage, and each being threadedly connected to a graphite intermediate electrode connected to the heater, a switch provided in a circuit between at least one conductive metal electrode and a voltage source for supplying power to the pair of conductive metal electrodes, a current measurement device for measuring a value of electric current flowing through the heater, and a controller into which is input an electric current value measured by the current measurement device, and which turns the switch off, halting current flow, in the case where fluctuations in the current value beyond a tolerance range continue for the duration of a first time interval, and wherein the first time interval is of shorter duration than the time of continuous fluctuations of the measured current value beyond the tolerance range required for the occurrence of meltdown of the conductive metal electrode.

The inventors have ascertained that with the present invention, as shown in FIG. 2 and FIG. 4, in those instances where a crack 8 develops in the lower portion (the threaded aperture portion 6b) of the intermediate electrode 6, an electrical discharge phenomenon occurs in the crack portion 8 before any meltdown of the conductive metal electrode 5 occurs, resulting in minute fluctuations (vibrations) Z in a measured value $A_1$ of the electric current flowing through the heater 104. Furthermore, it was observed that the duration of the fluctuations Z was approximately constant (for example, 10 minutes).

Consequently, the electric current flowing through the heater 104 was continuously measured using an ammeter 10a, and if fluctuations Z in the measured value $A_1$ beyond a tolerance range H continued for the duration of a first predetermined time interval $T_1$ (for example, 5 minutes) as shown in FIG. 2, the controller 12 turns off the switch 11, halting the current flow from the voltage source 9 to the pair of conductive metal electrodes 5, 5, thereby preventing any meltdown of the conductive metal electrodes.

Another configuration of the present invention is provided with an alarm, and in the case where fluctuations in the current value beyond the tolerance range continue for the duration of a second time interval, which is shorter than the first time interval, the controller first activates the alarm.

With this configuration of the invention, if fluctuations Z beyond the tolerance range H continue for the duration of the second time interval $T_2$ (for example, 1 minute), which is shorter than the first time interval $T_1$, then first the controller 12 activates the alarm 13, immediately informing the operator of the presence of the aforementioned crack.

Yet another configuration of the present invention is provided with an electrical power measurement device for measuring the electrical power supplied to the heater, and the electric current value as measured by the electric current measurement device, and the electrical power value as measured by the electrical power measurement device are input continuously to the controller which calculates a resistance value, and in the case where fluctuations in the resistance value beyond the tolerance range continue for the duration of the first time interval, the controller turns the switch off The invention is not limited to configurations where fluctuations in the electric current are used as a basis for activating an alarm or halting current flow to the heater, and configurations where a resistance value is calculated from the value of the electric current and the electrical power supplied to the heater, and fluctuations in this resistance value then used as a basis for activating an alarm or halting current flow to the heater, are also possible.

BRIEF DESCRIPTION OF THE DRAWINGS

FIG. 3A is a diagram showing fluctuations in measured electric current value due to a crack, while

FIG. 5A is a plan view of an example of the heater, while

DESCRIPTION OF THE PREFERRED EMBODIMENTS

Next is an explanation of the preferred embodiments of the present invention with reference to the drawings.

Figure 1:
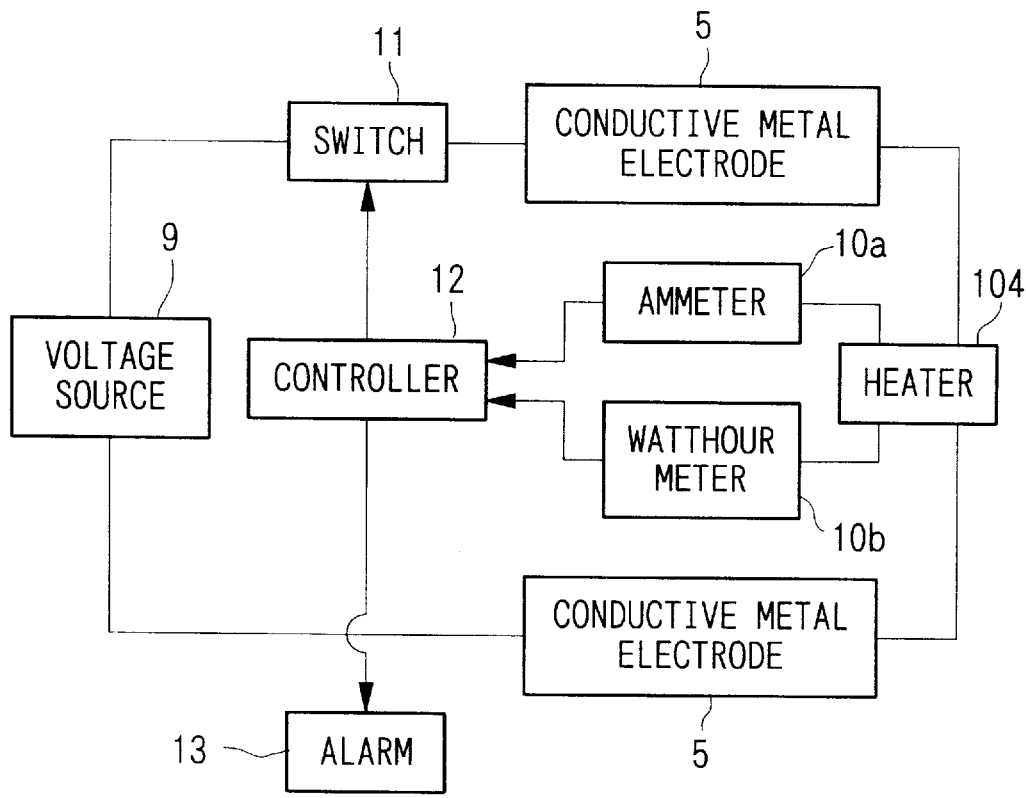
FIG. 1 is a control block diagram for one embodiment of an apparatus of the present invention for preventing heater electrode meltdown in a single crystal pulling apparatus.
Figure 2:
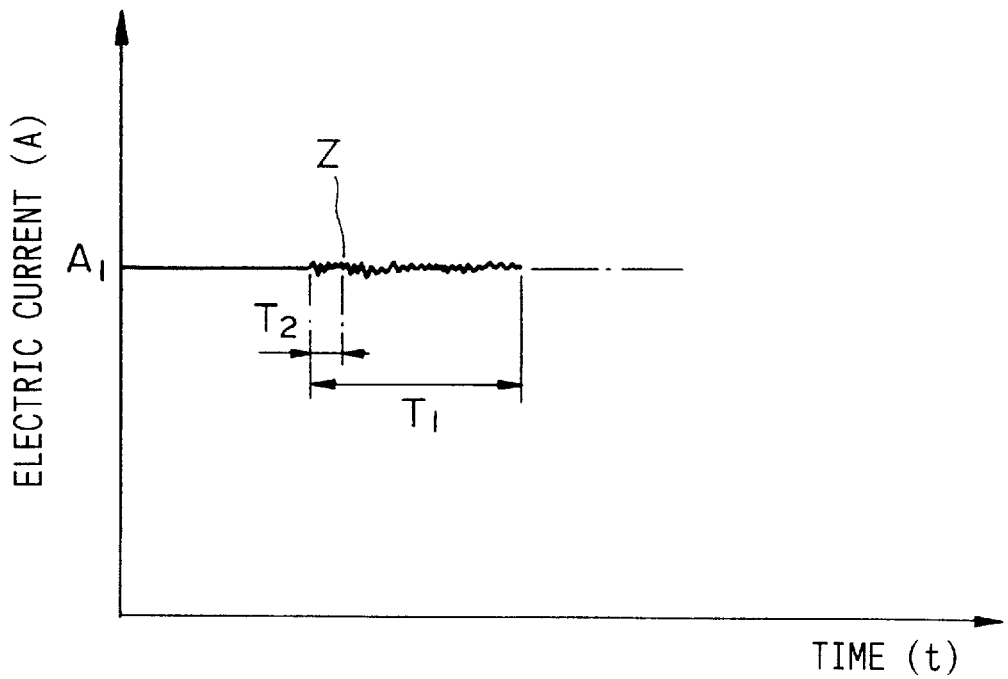
FIG. 2 is a graph showing time (t) along the horizontal axis and measured electric current value ($A_1$) along the vertical axis.

A control block diagram of one embodiment of the apparatus of the present invention for preventing heater electrode meltdown in a single crystal pulling apparatus is shown in FIG. 1, while a graph showing time (t) along the horizontal axis and measured electric current value ($A_1$) along the vertical axis is shown in FIG. 2.

Figure 4:
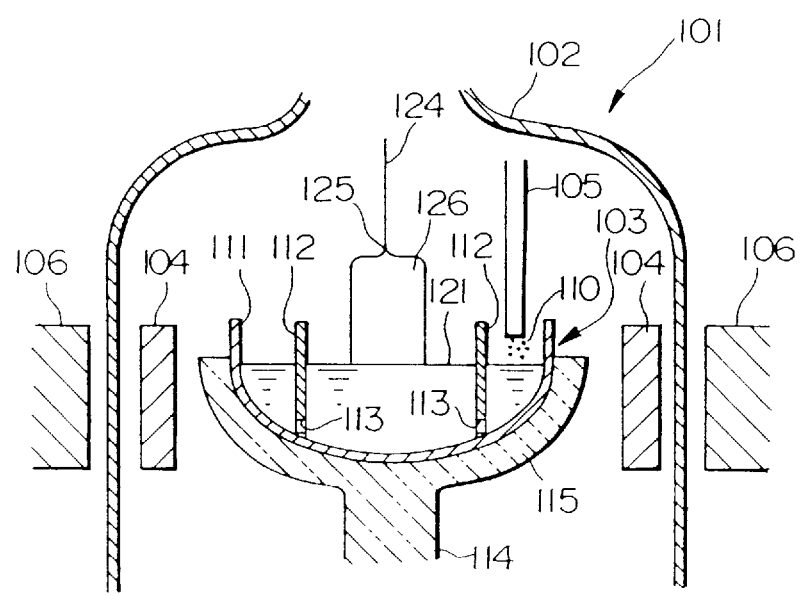
FIG. 4 is a cross-sectional view showing an example of a silicon single crystal pulling apparatus which employs the CMCZ technique.
Figure 5A:
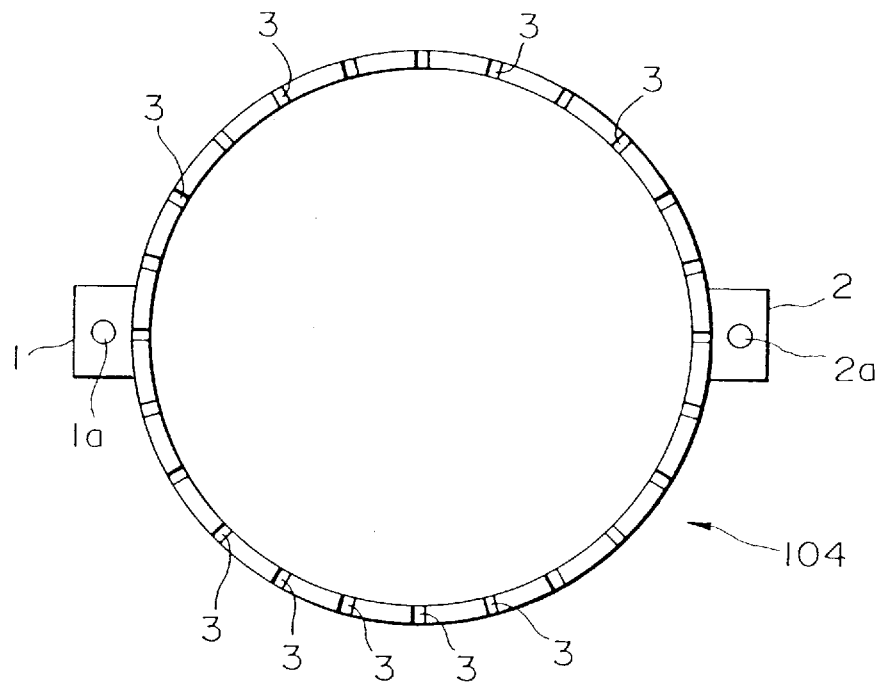
Figure 5B:
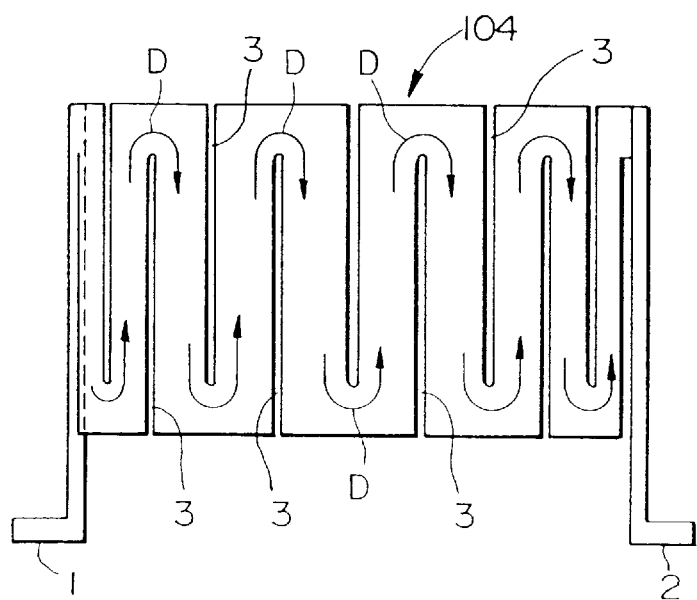
FIG. 5B is an elevation view of the example of the heater.
Figure 6:
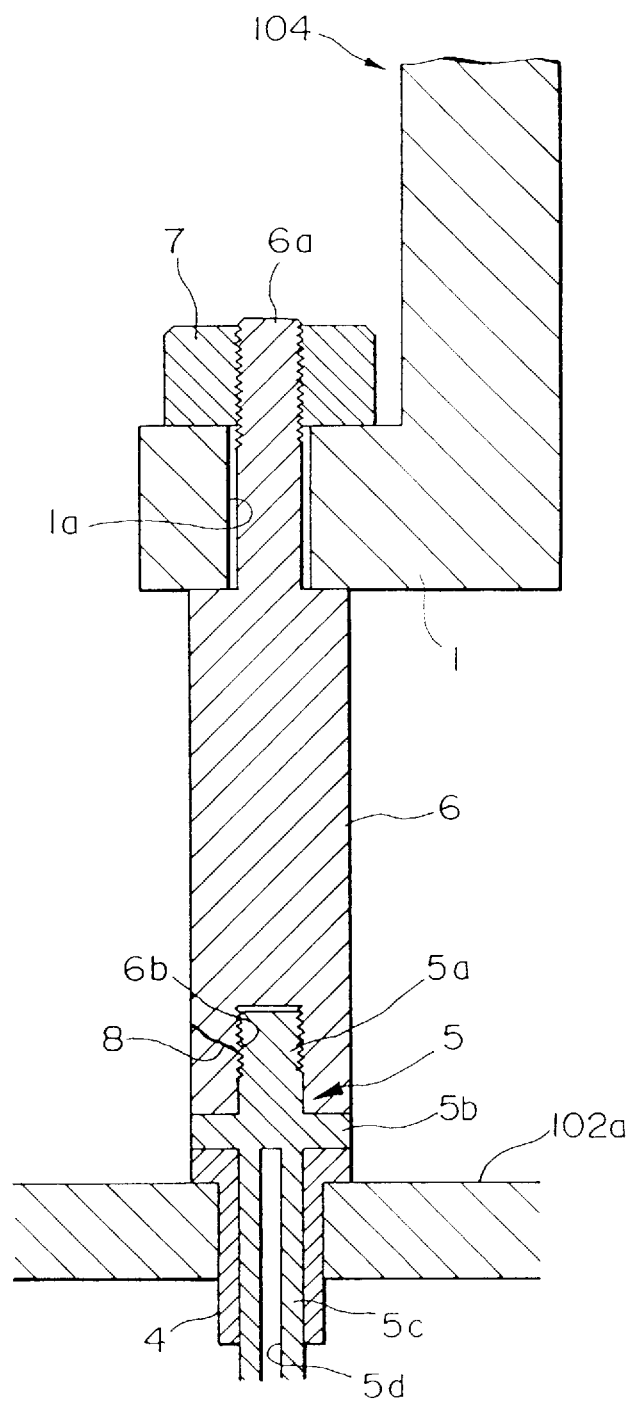
FIG. 6 is an enlarged view of an electrode portion of the heater.

The construction of this embodiment is identical to that shown in FIGS. 4–6, referred to in the explanation of the related art, and so the explanation is omitted here. As shown in FIG. 1 and FIG. 4, a voltage source 9 applies a voltage across a pair of copper electrodes (conductive metal electrodes) 5, 5 causing a current to flow through a heater 104. Heat from the heater 104 heats and then melts a semiconductor source material inside a crucible, and then maintains the temperature of a resultant semiconductor melt 121. A switch 11 is provided in the circuit between the voltage source 9 and one of the copper electrodes 5. When the switch is turned on, current flows from the voltage source 9 to the pair of copper electrodes 5, 5, while when the switch is turned off this current flow is halted. The turning on and off of the switch 11 is performed by a controller 12 described below. An ammeter 10a acts as an electric current measurement device which continuously detects (measures) the electric current flowing through the heater 104 (refer to FIG. 2 for detection results).

A watthour meter 10b, which acts as an electrical power measurement device in a different embodiment described below, is unnecessary in this embodiment.

The controller 12 is supplied continuously with an input from the ammeter 10a, of the measured electric current $A_1$ flowing through the heater, and in those cases where fluctuations Z in the measured value $A_1$ beyond the tolerance range H continue for the duration of a first predetermined time interval $T_1$ (for example, 5 minutes) which is described below, the controller 12 turns off the switch 11, halting the current flow to the heater 104. Thus, when the measured value $A_1$ fluctuates beyond the tolerance range H for the duration of the predetermined time interval $T_1$, the controller 12 turns the switch 11 off The first predetermined time interval $T_1$ is an interval of shorter duration than the time of continuous fluctuations of the continuously measured current value $A_1$ beyond the tolerance range H required for the occurrence of meltdown of the copper electrode 5 (in this example approximately 10 minutes). Furthermore, when the measured value $A_1$ fluctuates beyond the tolerance range H for the duration of a second predetermined time interval $T_2$ (for example one minute) which is shorter than the first predetermined time interval $T_1$, the controller 12 first activates an alarm 13. This alarm 13 is fitted, for example, to an operating panel of the single crystal pulling apparatus. The values of the first predetermined time interval $T_1$ and the second predetermined time interval $T_2$ are preset in the controller 12.

Next is an explanation of the operation of this embodiment of the apparatus for preventing heater electrode meltdown.

As shown in FIG. 2, in order to heat and melt the semiconductor source material inside the crucible, and then maintain the temperature of the subsequently produced semiconductor melt 121 (refer to FIG. 4), the controller 12 turns the switch 11 on, thus applying a voltage across the pair of copper electrodes 5, 5 and supplying a constant standard electric current $A_1$ (for example 1500 amperes) to the heater 104. Furthermore, the electric current flowing through the heater 104 is continuously monitored by the ammeter 10a.

In those instances where, due to various factors, cracks 8 develop in the lower portion (threaded portion) of the intermediate electrodes 6 (refer to FIG. 6), an electrical discharge phenomenon occurs in the cracks 8, and a minute fluctuation (vibration) Z develops in the detected value $A_1$ of the electric current.

Figure 3A:
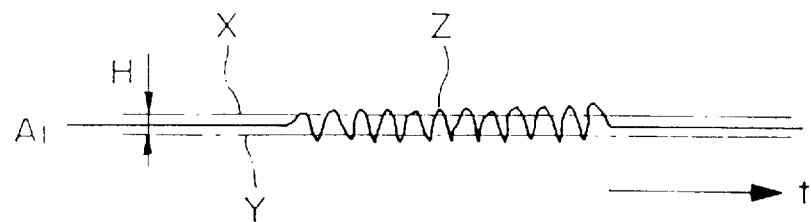

If this fluctuation Z is beyond the tolerance range represented by an upper limit X and a lower limit Y, as shown in FIG. 3A, and moreover continues for the duration of the second predetermined time interval $T_2$ (in this example, one minute), then the controller 12 activates the alarm 13. This allows the operator of the single crystal pulling apparatus to be informed of the development of the aforementioned cracks. Thus, when a fluctuation Z beyond the tolerance range H develops in the electric current value, the initial alarm activation means the operator can be informed immediately of the development of cracks 8 in one of the intermediate electrodes 6 (refer to FIG. 6), and as a result can, for example, immediately replace the intermediate electrode 6, thus preventing any decrease in productivity. A fluctuation Z beyond the tolerance range H is defined as being the phenomenon where either the maximum value of the fluctuation Z is above the upper limit value X of the tolerance range H, or the minimum value of the fluctuation Z is below the lower limit value Y of the tolerance range.

Furthermore, if the type of fluctuations Z shown in FIG. 3A continue for longer than the first predetermined time interval $T_1$ (in this example, 5 minutes), the controller 12 immediately turns the switch 11 off. This enables meltdown of the copper electrodes 5 such as shown in FIG. 6 to be prevented. Thus, in those instances where a predetermined fluctuation develops in the electric current value flowing through the heater 104, by halting the current supply to the pair of copper electrodes 5, 5 of the heater 104, meltdown of the copper electrodes is prevented, and bubbling of the water coolant into the inside of the chamber 102 (refer to FIG. 4) can be avoided. In this example, the upper limit value X and the lower limit value Y represent respectively a ±5% deviation from the standard electric current value $A_1$.

Figure 3B:
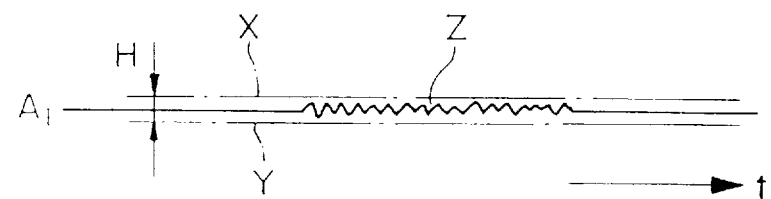
FIG. 3B is a diagram showing fluctuations in measured electric current value due to measurement device error and other external disturbances.

In those instances where, due to factors such as measurement device error and external disturbance, fluctuations Z such as shown in FIG. 3B occur, where the fluctuations remain within the tolerance range bounded by the upper limit value X and the lower limit value Y, the controller will not diagnose these fluctuations Z as being due to the development of cracks, and will leave the switch 11 turned on. Thus, in those instances where errors in the measurement devices such as the ammeter 10a, or external disturbances, produce fluctuations in the current value and resistance value, then current flow is continued, with no decrease in productivity of the single crystal pulling process.

With the above embodiment, fluctuations in the electric current value were used as a basis for activating the alarm and halting current flow to the heater. However the invention is not limited to this, and in the same way that control of the current flow was based on fluctuations in electric current value in the example above, the resistance can be continuously calculated from the electric current value and the value of the electrical power supplied to the heater 104, and fluctuations in this resistance value then used as a basis for activating the alarm and halting the current flow to the heater.

To sum up, as shown in FIG. 1, the electrical power supplied to the heater 104 is measured continuously by the watthour meter 10b, and the electric current value as measured by the ammeter 10a and the electrical power value as measured by the watthour meter 10b are input continuously to the controller 12 which continuously calculates a resistance value, and in those instances where fluctuations in the resistance value beyond the tolerance range continue for the duration of the first predetermined time interval, the controller 12 turns the switch 11 off Furthermore, when the resistance value fluctuates beyond the tolerance range for the duration of the second predetermined time interval, which is shorter than the first predetermined time interval, the controller 12 activates the alarm 13.

The single crystal pulling apparatus used in the embodiments, employed the CMCZ technique. However the use of other single crystal production techniques is also possible. For example, the use of the continuous charge CZ technique (CCZ technique), or of single crystal pulling apparatus equipped not with a double crucible, but with a single crucible, is also possible.

What is claimed is:

1. An apparatus for preventing a heater electrode meltdown in a single crystal pulling apparatus, said apparatus comprising:

a gas tight container, a crucible for storing a semiconductor melt inside said gas tight container, a heater which encircles said crucible, a pair of conductive metal electrodes, each having a water coolant passage, and each being threadedly connected to a graphite intermediate electrode connected to said heater, a switch provided in a circuit between at least one conductive metal electrode and a voltage source for supplying power to said pair of conductive metal electrodes, current measurement means for measuring a value of electric current flowing through said heater, and a controller into which is input an electric current value measured by said current measurement means, and which turns said switch off, halting current flow, in the case where fluctuations in said current value beyond a tolerance range continue for the duration of a first time interval, and wherein said first time interval is of shorter duration than the time of continuous fluctuations of the measured current value beyond the tolerance range required for the occurrence of meltdown of said conductive metal electrode.

2. An apparatus for preventing a heater electrode meltdown in a single crystal pulling apparatus, said apparatus comprising:

a gas tight container, a crucible for storing a semiconductor melt inside said gas tight container, a heater which encircles said crucible, a pair of conductive metal electrodes, each having a water coolant passage, and each being threadedly connected to a graphite intermediate electrode connected to said heater, a switch provided in a circuit between at least one conductive metal electrode and a voltage source for supplying power to said pair of conductive metal electrodes, current measurement means for measuring a value of electric current flowing through said heater, and a controller into which is input an electric current value measured by said current measurement means, and which turns said switch off, halting current flow, in case where fluctuations in said current value beyond a tolerance range continue for the duration of a first time interval, and wherein said first time interval is of shorter duration than the time of continuous fluctuations of the measured current value beyond the tolerance range required for the occurrence of meltdown of said conductive metal electrode, wherein there is provided an alarm, and in the case where fluctuations in said current value beyond the tolerance range continue for the duration of a second time interval, which is shorter than said first time interval, said controller first activates said alarm.

3. An apparatus for preventing a heater electrode meltdown in a single crystal pulling apparatus, said apparatus comprising:

a gas tight container, a crucible for storing a semiconductor melt inside said gas tight container, a heater which encircles said crucible, a pair of conductive metal electrodes, each having a water coolant passage, and each being threadedly connected to a graphite intermediate electrode connected to said heater, a switch provided in a circuit between at least one conductive metal electrode and a voltage source for supplying power to said pair of conductive metal electrodes, current measurement means for measuring a value of electric current flowing through said heater, and a controller into which is input an electric current value measured by said current measurement means, and which turns said switch off, halting current flow, in case where fluctuations in said current value beyond a tolerance range continue for the duration of a first time interval, and wherein said first time interval is of shorter duration than the time of continuous fluctuations of the measured current value beyond the tolerance range required for the occurrence of meltdown of said conductive metal electrode, wherein there is provided electrical power measurement means for measuring the electrical power supplied to said heater, and the electric current value as measured by said electric current measurement means, and the electrical power value as measured by said electrical power measurement means are input to said controller which calculates a resistance value, and in the case where fluctuations in said resistance value beyond the tolerance range continue for the duration of said first time interval, said controller turns said switch off.

4. An apparatus for preventing a heater electrode meltdown in a single crystal pulling apparatus, said apparatus comprising:

a gas tight container, a crucible for storing a semiconductor melt inside said gas tight container, a heater which encircles said crucible, a pair of conductive metal electrodes, each having a water coolant passage, and each being threadedly connected to a graphite intermediate electrode connected to said heater, a switch provided in a circuit between at least one conductive metal electrode and a voltage source for supplying power to said pair of conductive metal electrodes, current measurement means for measuring a value of electric current flowing through said heater, and a controller into which is input an electric current value measured by said current measurement means, and which turns said switch off, halting current flow, in case where fluctuations in said current value beyond a tolerance range continue for the duration of a first time interval, and wherein said first time interval is of shorter duration than the time of continuous fluctuations of the measured current value beyond the tolerance range required for the occurrence of meltdown of said conductive metal electrode, wherein there is provided electrical power measurement means for measuring the electrical power supplied to said heater, and the electric current value as measured by said electric current measurement means, and the electrical power value as measured by said electrical power measurement means are input to said controller which calculates a resistance value, and in the case where fluctuations in said resistance value beyond the tolerance range continue for the duration of said first time interval, said controller turns said switch off, wherein there is provided an alarm, and in the case where fluctuation in said current value beyond the tolerance range continue for the duration of a second time interval, which is shorter than said first time interval, said controller first activates said alarm.

* * * * *